United States Patent [19]

Goddeau

[11] Patent Number: 4,765,793
[45] Date of Patent: Aug. 23, 1988

[54] APPARATUS FOR ALIGNING CIRCULAR OBJECTS

[75] Inventor: David Goddeau, Palo Alto, Calif.

[73] Assignee: Proconics International, Inc., Woburn, Mass.

[21] Appl. No.: 825,618

[22] Filed: Feb. 3, 1986

[51] Int. Cl.⁴ .............................................. B65G 17/32
[52] U.S. Cl. .................................... 414/416; 414/222; 414/757
[58] Field of Search ............... 414/416, 417, 222, 225, 414/754, 757, 763, 783

[56] References Cited

U.S. PATENT DOCUMENTS

| | | | |
|---|---|---|---|
| 3,820,647 | 6/1974 | Waugh, Jr. et al. ............ | 414/757 X |
| 3,865,254 | 2/1975 | Johannsmeier .................. | 414/757 X |
| 3,972,424 | 8/1976 | Levy et al. ...................... | 414/757 X |
| 4,315,705 | 2/1982 | Flint ................................ | 414/222 X |
| 4,402,613 | 9/1983 | Daly et al. ....................... | 414/416 X |
| 4,457,664 | 7/1984 | Judell et al. . | |
| 4,493,606 | 1/1985 | Foulke et al. . | |
| 4,498,833 | 2/1985 | Hertel ............................. | 414/222 X |
| 4,594,768 | 6/1986 | Garter et al. .................... | 414/225 X |
| 4,603,897 | 8/1986 | Foulke et al. ................... | 414/416 X |
| 4,655,584 | 4/1987 | Tanaka et al. ................... | 414/225 X |

*Primary Examiner*—Kenneth J. Dorner
*Assistant Examiner*—Thomas A. Rendos

[57] ABSTRACT

Apparatus for aligning an object having a distinguishing feature in it, the apparatus including rotator means for holding and rotating the object about a rotation axis so that a portion of the surface including the distinguishing feature travels through a surface sensing region, engagement means for engaging the object and transferring it to and receiving it from the rotator means, sensing means for measuring and recording, during rotation of the object, position versus angular orientation information relating to position of the surface along an axis transverse to the surface, calculating means, responsive to the sensing means, for calculating from the position versus angular orientation information both the angular orientation of the distinguishing feature and the location of the center of the object with respect to the rotation axis, and alignment correction means for generating angular correction signals for rotating the object such that the distinguishing feature attains a predetermined angular orientation and for generating alignment signals for aligning the center with respect to the rotation axis. Also disclosed are identifying the angular orientation of the distinguishing feature by identifying where the slope of the position versus angular orientation function is greater than a predetermined amount; and obtaining the position versus angular orientation information using a first digital measuring means to measure the angle and a second digital measuring means to measure the relative height of a portion of the object.

19 Claims, 6 Drawing Sheets

APPARATUS FOR ALIGNING CIRCULAR OBJECTS

BACKGROUND OF THE INVENTION

The invention relates to the alignment of an object having a feature sufficient to distinguish various angular orientations of the object, e.g., a circular semiconductor wafer having a flat on its edge.

Semiconductor wafer production requires, as one of its steps, the alignment of the wafers. Alignment of the flat on the edge of a wafer has often been accomplished by using a roller that rotates a wafer as long as it contacts the wafer's circular surface and ceases rotating the wafer once it contacts the wafer's flat surface, e.g., as shown in Foulke et al. U.S. Pat. No. 4,493,606, which is hereby incorporated by reference.

Judell et al. U.S. Pat. No. 4,457,664 discloses a different method of aligning wafers. The wafer is rotated so that its edge passes a capacitive sensor to obtain information on the distance of the edge from the axis of rotation; based on that distance versus angular orientation information, the wafer is realigned with respect to its centroid. The wafer is then rotated a second time to obtain further information relating to the present angular position of a flat on the edge of the wafer, and a threshold value is used to determine the location of the midpoint of the flat.

SUMMARY OF THE INVENTION

In general, the invention features in one aspect apparatus for aligning an object having a surface with a distinguishing feature in it, the apparatus including rotator means for holding and rotating the object about a rotation axis so that a portion of the surface including the distinguishing feature travels through a surface sensing region, engagement means for engaging the object and transferring it to and receiving it from the rotator means, sensing means for measuring and recording, during rotation of the object, position versus angular orientation information relating to position of the surface along an axis transverse to the surface, calculating means, responsive to the sensing means, for calculating from the position versus angular orientation information both the angular orientation of the distinguishing feature and the location of the center of the object with respect to the rotation axis, and alignment correction means for generating angular correction signals for rotating the object such that the distinguishing feature attains a predetermined angular orientation and for generating alignment signals for aligning the center with respect to the rotation axis.

In preferred embodiments, the surface is circular, and its entire perimeter passes through the sensing region; the distinguishing feature is a flat, and the calculating means identifies the angular orientation of a line through the rotation axis and perpendicular to the flat by representing the position versus angular orientation information as a function and identifying the section of the function delineated by two points having slopes greater than a predetermined amount and a third point between them at which the slope of the function changes sign; there are a plurality of flats on the object, and the major flat is identified by the distance between the first and second points; the object is a semiconductor wafer transferred between plastic and quartz boats by the engagement means; and a paddle of the engagement means is adjusted in response to alignment signals before and after receiving the wafer from the rotator.

In another aspect the invention features apparatus for aligning an object having a circular surface with a distinguishing feature in it, the apparatus including rotator means for holding the object and rotating the object about a rotation axis so that the entire perimeter of the circular surface travels through a surface sensing region, engagement means for engaging the object and transferring it to and receiving it from the rotator means, sensing means for measuring and recording, during rotation of the object, position versus angular orientation information relating to position of the surface along an axis transverse to the surface, calculating means, responsive to the sensing means, for calculating the angular orientation of the distinguishing feature by representing the position versus angular orientation information as a function having a first variable representing the position and a second variable representing the angular orientation, and for identifying a section of the function where the function has a slope with a magnitude greater than a predetermined amount that is too large to correspond to a slope caused by the object being off center, and alignment correction means for generating angular correction signals for rotating the object such that the distinguishing feature attains a predetermined angular orientation.

In yet another aspect the invention features apparatus for aligning an object having a circular surface with a distinguishing feature in it, the apparatus including rotator means for holding and rotating the object about a rotation axis so that the entire circular surface travels through a surface sensing region, engagement means for engaging the object and transferring it to and receiving it from the rotator means, a first digital measuring means for digitally measuring the angular orientation of the object, a second digital measuring means for digitally measuring the relative height of a portion of the object in the sensing region, a digital recording means, responsive to the first and second digital measuring means, for recording a plurality of pairs of values, one pair being recorded each time the angular position changes by a predetermined amount, a first value of the pair representing the present angular orientation of the object and a second value of the pair representing the present relative height of the object, calculating means, responsive to the digital recording means, for calculating from the position versus angular orientation information the angular orientation of the distinguishing feature, and alignment correction means for generating angular correction signals for rotating the object such that the distinguishing feature attains a predetermined angular orientation.

In preferred embodiments the second digital measurement means includes a radiation source on one side of the object and a linear detector array on the other side.

In still another aspect the invention features apparatus for aligning an object having a circular surface, the apparatus including rotator means for holding and rotating the object about a rotation axis so that the entire perimeter of said circular surface travels through a surface sensing region, engagement means for engaging the object and transferring it to and receiving it from the rotator means, a first digital measuring means for digitally measuring the angular orientation of the object, a second digital measuring means for digitally measuring the relative height of a portion of the object in the sensing region, a digital recording means, responsive to the first and second digital measuring means, for recording a plurality of pairs of values, one pair being recorded each time the angular position changes by a predetermined amount, a first value of the pair representing the present angular orientation of the object and a second value of the pair representing the present relative height of the object, calculating means, responsive to the digital recording means, for calculating from the position versus angular orientation information the location of the center of the object with respect to the rotation axis, and alignment correction means for generating alignment signals for aligning said center with respect to said rotation axis.

Other advantages and features of the invention will be apparent from the following description of the preferred embodiment thereof.

DESCRIPTION OF THE PREFERRED EMBODIMENT

The drawings will be described first.

Drawings

STRUCTURE

Figures 1, 2, 3, 4:
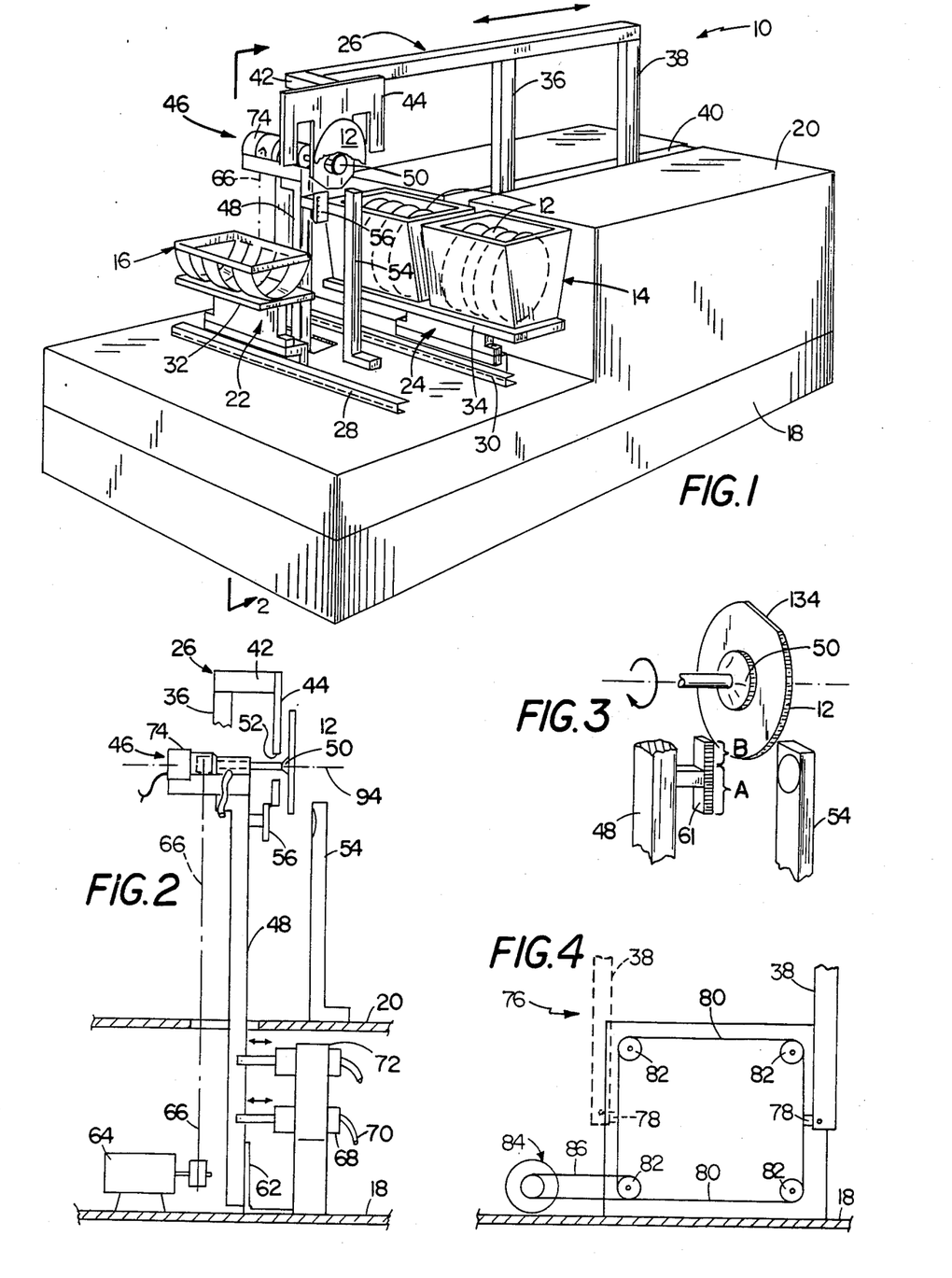
FIG. 1 is a diagrammatic perspective view of wafer handling apparatus including alignment means according to the invention.
FIG. 2 is a diagrammatic sectional view, taken at 2—2 of FIG. 1, of part of the FIG. 1 apparatus.
FIG. 3 is a diagrammatic perspective view showing operation of detector components of the FIG. 1 apparatus.
FIG. 4 is a diagrammatic elevation showing the drive system for a wafer engagement and transport paddle of the FIG. 1 apparatus.

Referring to FIG. 1, there is shown wafer handling device 10, for transferring semiconductor wafers 12 between plastic boats 14 and quartz boat 16 (in which the wafers are held when put into a diffusion furnace). Device 10 has base 18 (upon which cover 20 rests), trolleys 22, 24 for transporting the boats, and wafer transfer arm 26. Trolleys 22, 24 extend through slots 28, 30 respectively, of cover 20. Trolley 22 has affixed to its upper end platform 32, which supports quartz boat 16. Trolley 24 has affixed to its upper end platform 34, which supports plastic boats 14. Wafer transfer arm 26 is attached to vertical arms 36, 38, which extend through slot 40 in cover 20. A right angle member 42 connects arm 26 to aluminum wafer paddle 44, which has suction openings in its center leg for gripping wafers. In traveling between plastic boats 14 and quartz boats 16, paddle 44 travels vertically upward from one boat to lift a wafer out of the boat, moves horizontally to a position above the other boat, and then moves vertically downward into the other boat. The structure and operation of wafer transfer paddle 44, boat trolleys 22, 24 and the mechanisms driving them are described in more detail in U.S. Pat. No. 4,493,606, referred to above.

Referring to FIGS. 1-3, apparatus 10 includes rotator 46 located halfway along the path of travel of paddle 44 between the plastic and quartz boats and used to align wafers 12. Rotator 46 is mounted on support arm 48 and has a vacuum chuck 50 that is movable back and forth through hole 52 in paddle 44. Chuck 50 is able to hold and rotate a wafer 12 between incandescent light source 54 and linear detector array 56, to determine the location of center 91 and flat 134 of a wafer 12 (FIG. 8), to permit wafer 12 to be properly aligned. Linear detector array 56 is composed of 256 detectors 61.

Referring to FIG. 2, chuck 50 is rotatably driven by linear servomotor 64 via pulley and belt mechanism 66. Pneumatic actuator 68, supplied by hose 70, is arranged to move arm 48 forward and backward, pivoting about flexure pivot 62, in order to move chuck 50 back and forth through hole 52. Pneumatic actuator 72, attached to arm 48 and having a restricted outlet, is arranged to dampen the movements caused by actuator 68 to prevent chuck 50 from traveling too far. Digital encoder 74 is attached to one end of rotator 46 and provides digital signals indicating the angular position of chuck 50 and, thus, wafer 12 attached to chuck 50.

Referring to FIG. 3, the sensing of the height of the lower edge of wafer 12 attached to vacuum chuck 50 is illustrated. It is seen that the number of detectors 61 exposed to light from light source 54 is a function of the position of the lower edge of wafer 12.

Referring to FIG. 4, there is shown drive system 76 for causing horizontal and vertical travel of wafer transfer paddle 44. Arm 38, on which paddle 44 is supported, is connected via means 78 to chain 80, supported by sprockets 82. Stepper motor 84 drives chain 86, which drives a sprocket connected to lower left hand sprocket 82. The two positions for arm 38 shown on FIG. 4 correspond to when paddle 44 is within the quartz and plastic boats.

Figure 5:
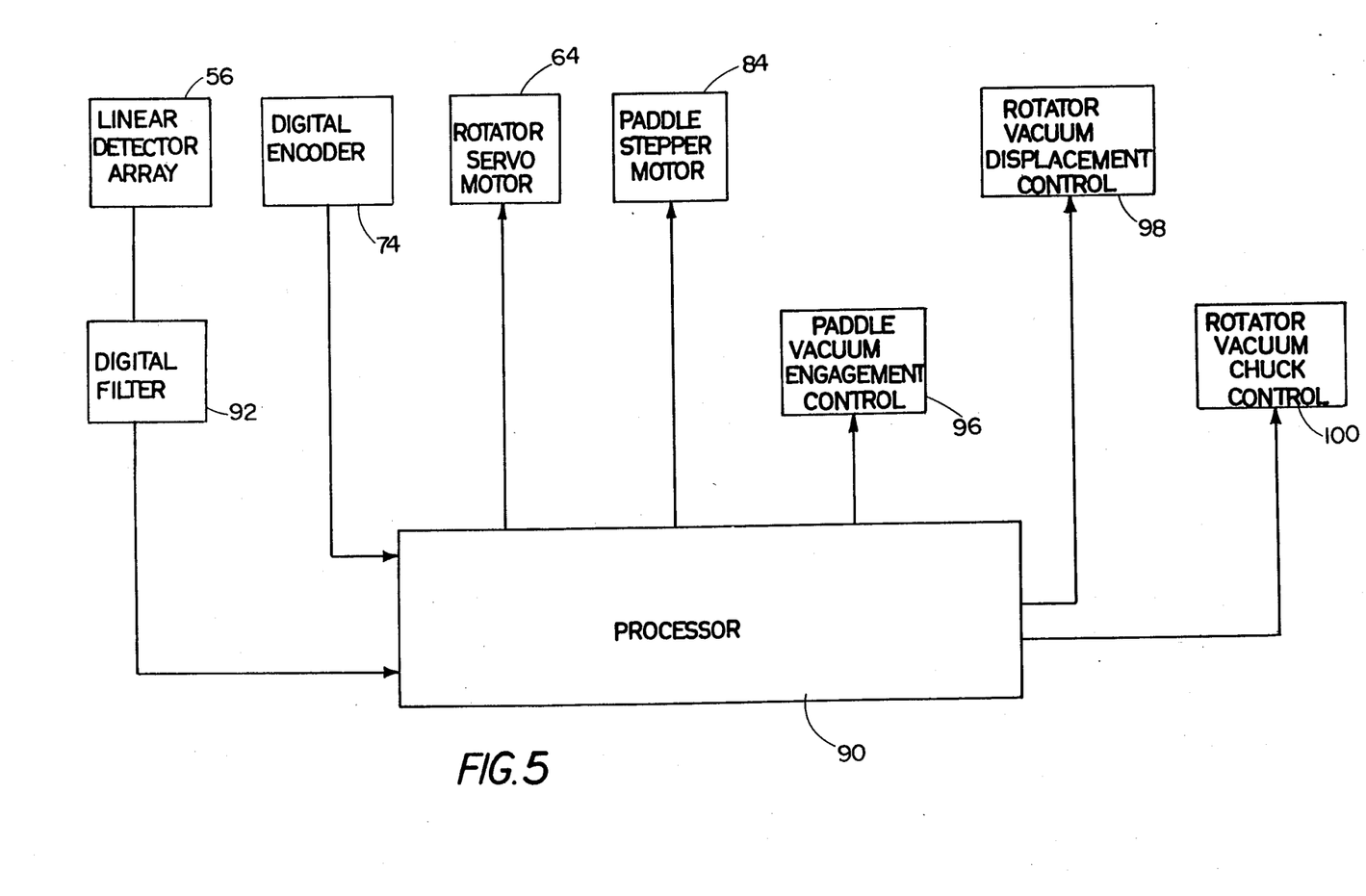
FIG. 5 is a block diagram of the automatic control system for the FIG. 1 apparatus.

The components of apparatus 10 providing information to processor 90 and receiving control signals from it in order to carry out the wafer position determination and wafer alignment functions are shown in FIG. 5. Linear detector array 56 is connected via digital filter 92 to processor 90, the signal arriving at processor 90 from filter 92 indicating the number of detectors shielded from light source 54 by the lower part of wafer 12. Digital encoder 74 provides signals indicating the angular position of chuck 50 and thus a wafer 12 supported on it. Processor 90 is connected to provide control signals to rotator servomotor 64, paddle stepper motor 84, paddle vacuum engagement control 96 (connected to paddle 44), rotator vacuum displacement control 98 (connected to line 70), and rotator vacuum chuck control 100 (connected to chuck 50). Signals provided by processor 90 to linear servomotor 64 control the rotation of motor 64 and thus wafer 12 on rotator 46. Signals to rotator displacement control 98 control forward and backward travel of vacuum chuck 50, and signals to chuck control 100 control the engagement of wafers 12 by chuck 50. Signals provided to stepper motor 84 control the vertical and horizontal travel of paddle 44, and signals to vacuum engagement control 96 control the engagement of wafers 12 by paddle 44. Processor 90 is programmed to carry out the automatic procedure of the flowcharts of FIGS. 9 and 10.

Operation

Figure 9:
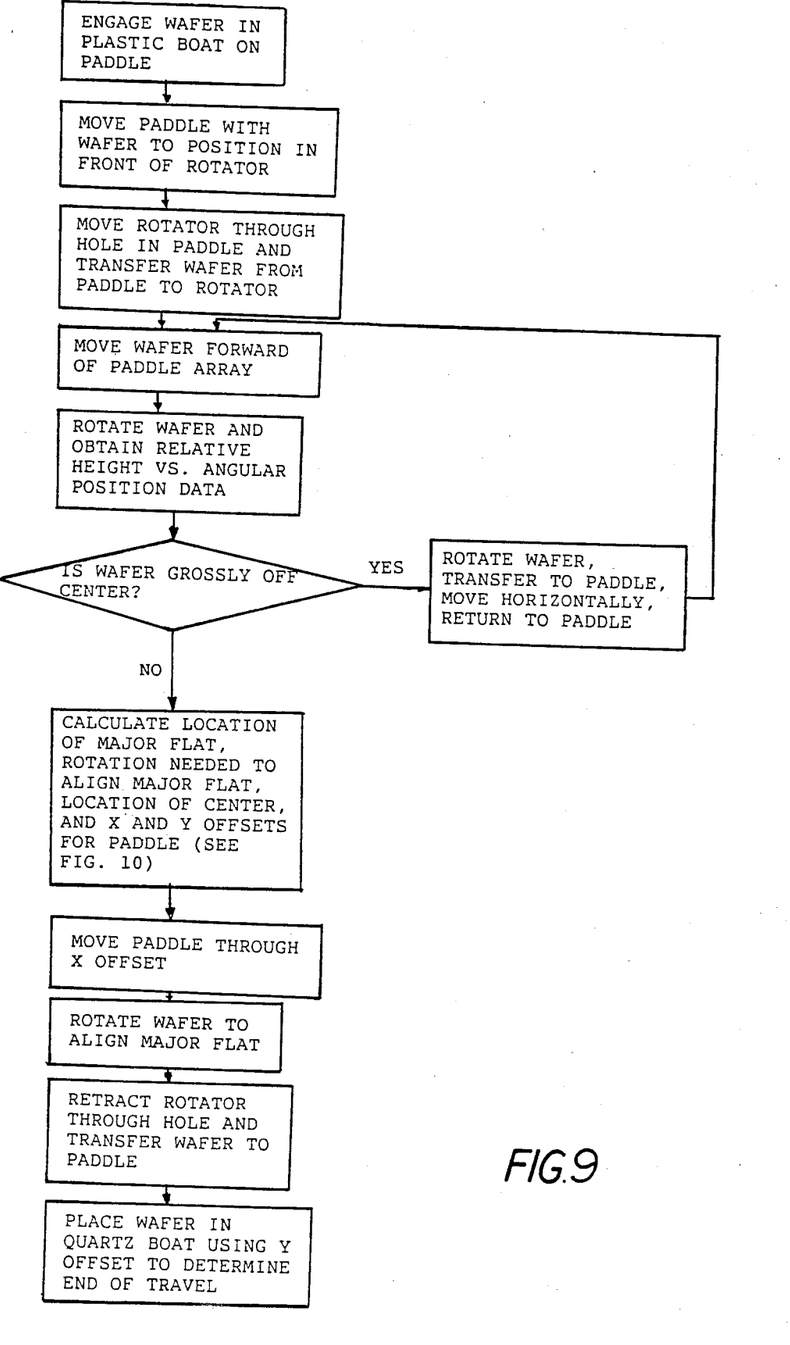
FIG. 9 is a flowchart of an automatic method carried out by the FIG. 1 apparatus to align wafers.

During the transfer of wafers 12 from a plastic boat 14 to quartz boat 16, the center and flat of each wafer is automatically properly aligned using rotator 46 and associated detector array 56 according to the method described in FIG. 9.

Referring to FIG. 1, paddle 44 engages a wafer 12 in plastic boat 14 using vacuum and is driven vertically upward and horizontally by stepper motor 84 (FIG. 4) to the position in front of vacuum chuck 50 of rotator 46, the vertical axis of symmetry of paddle 44 being aligned with axis of rotation 94 of rotator 46.

Referring to FIG. 2, pneumatic actuator 68 is activated to move vacuum chuck 50, from a resting position behind paddle 44, forward through hole 52 until a vacuum sensor (not shown) communicating with the vacuum line for chuck 50 indicates that chuck 50 has engaged wafer 12. Once chuck 50 has engaged wafer 12, paddle 44 releases wafer 12, whereupon chuck 50 moves forward slightly to the position shown in FIG. 2.

At this point both the location of center 91 and major flat 134 of wafer 12 (FIG. 8) are unknown. In order to obtain information indicating the location of the center and the major flat, wafer 12 is rotated through 380° to get angular position versus relative height data for the generally circular surface of wafer 12. Each time that encoder 74 indicates that wafer 12 has rotated a given small amount, processor 90 samples the signals from linear detector 56 indicating the present relative height of the lower edge of wafer 12 and stores this height in a location in its memory corresponding to the present angular position of wafer 12.

Referring to FIGS. 3 and 5, the signals from filter 92 connected to linear detector array 56 indicate the number of detectors 61 currently shielded by wafer 12 from incandescent source 54; these detectors are marked B. Those detectors illuminated by incandescent source 54 are marked A. In the example shown the illuminated detectors are all contiguous; this is not always the case, but in any event the total number of shielded detectors is still used to indicate the location of the lower edge of wafer 12.

As wafer 12 is rotated through 380°, the height of its lower edge relative to array 56 changes. Each flat causes a recognizable change. If the wafer's axis of rotation 94 on rotator 46 is not aligned at the center 91 of wafer 12 (FIG. 8), this also causes a different, recognizable change in the relative height.

Figure 6:
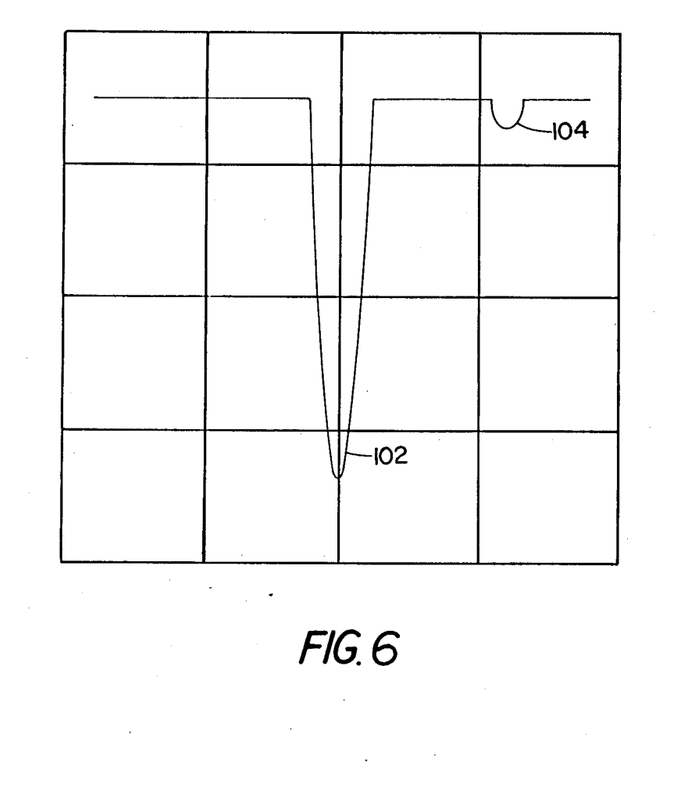
FIG. 6 is a graph of relative height (ordinate) versus angular position (abscissa) data for a wafer rotated on the FIG. 1 apparatus.

Referring to FIG. 6, there is shown a graph of relative height (ordinate) versus angular position (abscissa) data stored by processor 90 for a wafer whose axis of rotation is aligned with its center, so that the height is constant throughout its rotation except when wafer flats pass in front of detector 56. The segments of the graph corresponding to the flats are parabolic shaped segments 102, 104. While a continuous function is shown in FIG. 6, in reality the recorded data are discrete sampled points along the curve.

Figure 7:
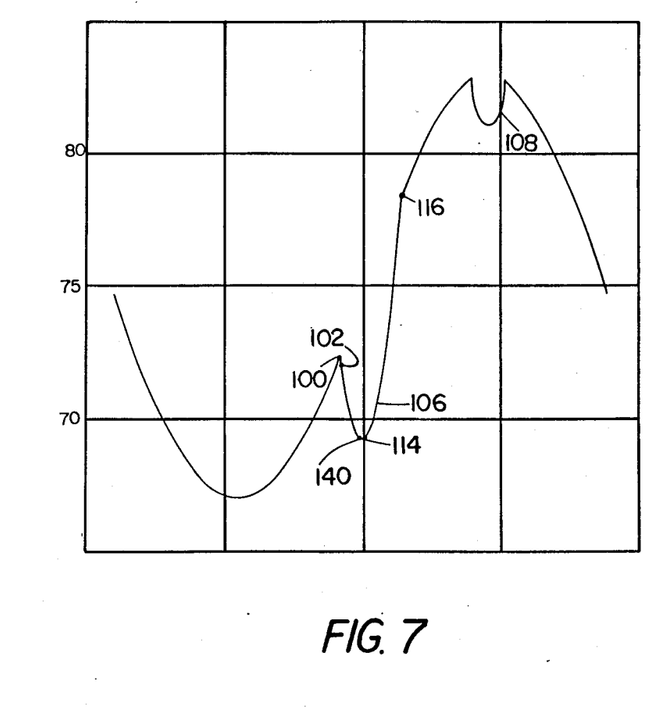
FIG. 7 is a graph of relative height (ordinate) versus angular position (abscissa) data for a wafer with a different position with respect to the rotator of the FIG. 1 apparatus.
Figure 8:
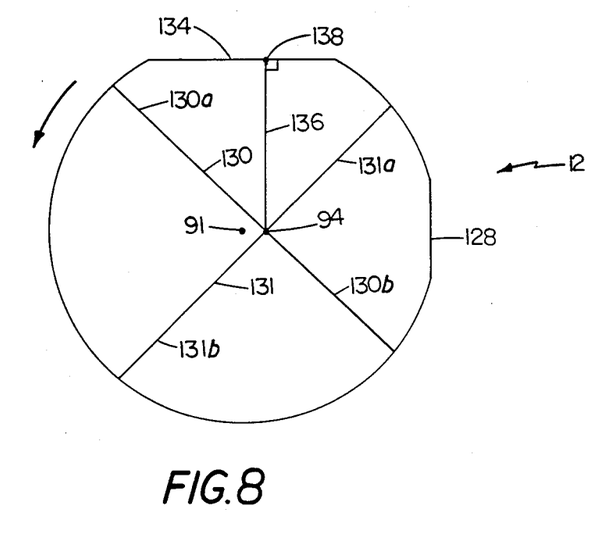
FIG. 8 is a diagrammatic plan view of a wafer aligned by the FIG. 1 apparatus.

Referring to FIG. 7, there is shown a graph of relative height (ordinate) versus angular position (abscissa) data for a wafer whose axis of rotation 94 is slightly displaced from its center 91, as shown in FIG. 8. This condition is recognizable from the predominantly sinusoidal shape of the graph. The segments on the graph corresponding to the flats are recognizable as those comprising parabolic-shaped segments 106, 108, and once again a continuous curve is shown, though the actually recorded data are sampled points along the curve. The wafer 12 shown in FIG. 8 thus must be aligned with respect to both the angular position of major flat 134 and the location of its center 91 before it is placed in quartz boat 16.

So long as wafer 12 is initially sufficiently centered that its lower edge always blocks some, but not all, of the 256 detectors 61, both the location of the center of the wafer with respect to its present axis of rotation and its present angular position of its major flat can be determined from data from the first rotation of wafer 12 as illustrated below. If this is not the case, processor 90 notes the angular positions at which the wafer blocked all detectors and then began to unblock some detectors, and rotator 46 rotates the wafer so that the angular position halfway between the two is made horizontal and then transfers the wafer to paddle 46, which is moved horizontally before releasing the wafer in a position with its center now closer to the axis of rotation.

Figure 10:
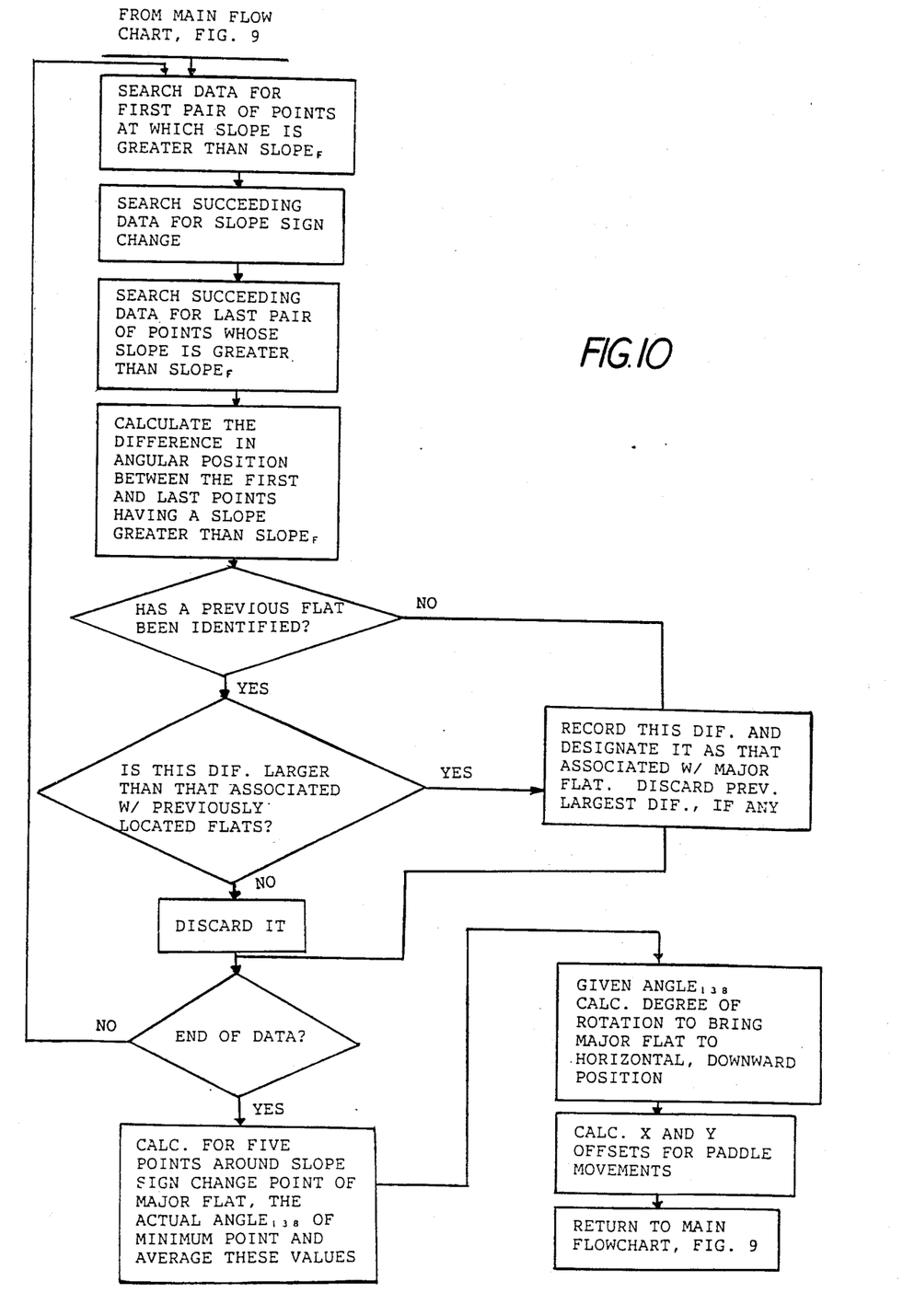
FIG. 10 is a detailed flowchart of a step of the FIG. 9 flowchart.

The next steps involved in aligning the wafer shown in FIG. 8 from the relative height versus angular orientation data—calculation of the angular position of the major flat, the degree of rotation needed to align the major flat, the location of the wafer center and the X and Y offsets—are described in detail in the flowchart of FIG. 10. First, for each data point of the relative height versus angle data, the difference between the relative height of that point and the one immediately following is calculated. This difference equals the slope of the graph between the two points. Processor 90 looks for the first pair of points for which the magnitude of the calculated slope is greater than a predetermined value, $SLOPE_F$ and records the angular position. $SLOPE_F$ is greater in magnitude than the steepest possible slope on a sinusoidal curve caused by a wafer being off center; thus slopes greater than $SLOPE_F$ can only indicate the presence of a flat on wafer 12. Referring again to FIG. 7 data points 100 and 102 are the first to exhibit a slope having the required magnitude greater than $SLOPE_F$, and this is recorded as generally indicating the beginning of the flat, in this case major flat 134 (FIG. 8).

The processor continues to calculate the slope at subsequent points and records the first change in the slope of the function from negative to positive, namely minimum data point 114 on FIG. 7. The processor then looks for the last point after minimum data point 114 that has a magnitude of the slope between it and the next point that is greater than $SLOPE_F$, namely data point 116 on FIG. 7; this is recorded as generally indicating the end of the flat.

Processor 90 continues to scan the data for other flats. Major flats and minor flats are distinguished by the difference in angular position between where the corresponding parabolic segments begin and end. The first flat located by processor 90 is designated as the major flat and the difference between its endpoints is recorded. The difference in the angular position of endpoints for subsequent flats is compared with the difference calculated and recorded for the previously designated major flat. If the difference calculated for the present flat is less than that of the previously designated major flat, it retains its designation as the major flat, and the present flat is designated as a minor flat. If the difference for the present flat is greater, the present flat is designated as the major flat, replacing the previously designated major flat, and the difference in the angular position of its two endpoints is recorded as the new maximum. Parabolic segment 108 (FIG. 7) corresponds to a minor flat 128 (FIG. 8), and accordingly has a smaller angular difference between its beginning and end.

Figure 11:
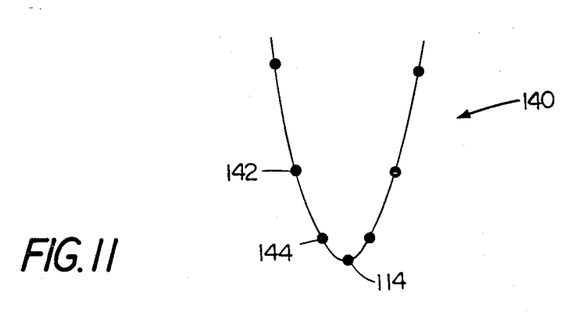
FIG. 11 is an enlargement of a portion of the FIG. 7 graph.

Minimum data point 114 is the sampled point that corresponds roughly to the point 138 (FIG. 8) on flat 134 from which line 136 drawn perpendicular to the flat passes through axis of rotation 94. The actual angular position of the intersection of line 136 with flat 134 is more specifically determined using a formula that involves curve-fitting a parabola to the sampled data points in portion 140 of parabolic segment 106, portion 140 including minimum sampled data point 114 and data points on both sides of the minimum point, as illustrated in FIG. 11. The location of a parabola's minimum can be determined from the location of another point on the parabola and the slope at that point if the parabolic constant is known, and this property is used to find the precise angular position of major flat 134 with respect to the present axis of rotation. Because the parabolic constant for segment 106 is unknown, in part because the actual radius of a wafer and the magnification inherent in the array are unknown, two data points are used simultaneously for each calculation of the location of the minimum. Given two points, e.g., 142 and 144, and their slopes, e.g., A and B, respectively, the formula for the angular location, $ANGLE_{138}$, of the actual minimum, corresponding to point 138 on flat 134, is:

$$ANGLE_{138} = (A \times (+1) - B \times (i))/B - A + OFFSET$$

where:
  i is the sample number for the data point, and thus is related to angular position and is the abcissa value for a given point, and
  OFFSET is the angular offset value, $-\frac{1}{2}$, to correct for the fact that the slopes at midpoints between adjacent data points are being used.

The slopes A and B are calculated as described above; i.e., the height H for each point, e.g., 142 or 144, is subtracted from the height H of the next point, e.g., 144 or 114. Substituting the actual relative height values (i.e., numbers of illuminated detectors 61) H for respective sample points to calculate slopes A and B results in:

$$ANGLE_{138} = \frac{(H_{i+1} - H_i)(i+1) - (H_{i+2} - H_{i+1})(i)}{(H_{i+2} - H_{i+1}) - (H_{i+1} - H_i)} + OFFSET$$

This calculation is performed for five pairs of points, and the average value is used. The difference between $ANGLE_{138}$ and the angle that places flat 134 in the desired bottom horizontal position is $ANGLE_F$.

Referring to FIG. 8, in order to align the wafer with respect to its center 91, the location of center 91 must be determined. This is done by defining two axes 130, 131, perpendicular to each other and the axis of rotation 94 and set at 45 degrees with respect to line 136, perpendicular to flat 134. In the coordinate system defined by axes 130, 131, the coordinates of the center 91 are given as offsets from axis of rotation 94. Along axis 130 the offset from axis 94 is equal to one-half of the length of axis section 130a (on one side of axis 94) minus the length of the axis section 130b (on the other side of axis 94), or $$130 \text{ OFFSET} = \frac{\text{length of } 130a - \text{length of } 130b}{2}$$

The lengths of 130a and 130b are simply the relative height, H, values for the points 45 degrees and 225 degrees clockwise, respectively from the angle, $ANGLE_{138}$, calculated for the major flat. The direction of the offset is indicated by the sign of the result. The same calculations are performed to calculate the offset along axis 131, 131 OFFSET. These offsets are translated into another coordinate system which defines the offsets in terms of the X and Y coordinate system of horizontal and vertical travel, respectively, of paddle 44. The offsets are effectively rotated so that they will be correct when the major flat has been rotated through $ANGLE_F$ to its predetermined position. The offset for the x-axis of the paddle's coordinate system is:

$$\text{x-axis offset} = (130 \text{ offset}) \times \cos(ANGLE_F) + (131 \text{ offset}) \times \sin(ANGLE_F)$$

The offset for the y-axis of the paddle's coordinate system is:

$$\text{y-axis offset} = (130 \text{ offset}) \times \sin(ANGLE_F) + (131 \text{ offset}) \times \cos(ANGLE_F)$$

Returning to the main flowchart of FIG. 9, processor 90 provides signals to rotator servomotor 64 to rotate wafer 12 through $ANGLE_F$ degrees, bringing major flat 134 to the desired horizontal position at the bottom of the wafer.

The x-axis offset is used to adjust the position of paddle 44 with respect to rotator 46 before wafer 12 is returned to the paddle by moving paddle 44 horizontally along the x-axis by stepper motor 84 (FIG. 4) the amount indicated by the x-axis offset in the direction indicated by the sign of the offset. In the case where the x-axis offset exceeds the maximum x-axis offset permitted by the size of hole 52, the x-axis offset is set to equal the maximum permitted value before moving paddle 44.

The wafer is transferred from rotator 46 to paddle 44, by retracting rotator 46 incrementally through hole 22 a short distance at a time. After each incremental move processor 90 checks to determine whether paddle 44 has engaged the wafer at its vacuum openings. Once the wafer has been engaged by paddle 44, chuck 50 releases the wafer, and rotator 46 continues to retract until it reaches its rearward point of travel behind paddle 44.

Paddle 44 is driven by stepper motor 84 to place the wafer into quartz boat 16. As paddle 44 descends with the wafer into the quartz boat, the y-axis offset is used to adjust the point of lowest descent. In this way the wafer transfer system avoids impacting the wafer against the bottom of the boat or dropping the wafer from a height higher than intended. The accurate positioning permitted by the X-axis offset similarly avoids scraping the sides of the quartz boat during descent, avoiding particulate contamination and damage to the wafer.

Other Embodiments

Other embodiments of the invention are within the scope of the claims.

E.g., instead of flats, other distinguishing features such as notches can be identified using slope information.

What is claimed is:

1. Apparatus for aligning an object having a surface with a distinguishing feature in it, said apparatus comprising rotator means for holding said object and rotating said object about a rotation axis so that a portion of said surface including said distinguishing feature travels through a surface sensing region, engagement means for engaging said object and transferring it to and receiving it from said rotator means, sensing means for measuring and recording, during rotation of said object, position versus angular orientation information relating to position of said surface along an axis transverse to said surface, calculating means, responsive to said sensing means, for calculating from said position versus angular orientation information both the angular orientation of said distinguishing feature and the location of the center of said object with respect to said rotation axis, and alignment correction means for generating angular correction signals for rotating said object such that said distinguishing feature attains a predetermined angular orientation and for generating alignment signals for aligning said center with respect to said rotation axis.

2. The apparatus of claim 1 wherein said surface is circular and said rotator means includes means for rotating said object so that the entire perimeter of said circular surface passes through said sensing region.

3. The apparatus of claim 2 wherein said distinguishing feature comprises a flat on said surface, said calculating means comprises means for locating the angular orientation of said flat, by representing said information as a function having a first variable representing said position and a second variable representing said angular orientation, and by identifying a section of said function delineated by first and second points where said function has a slope with a magnitude greater than a predetermined amount that is too large to correspond to a slope caused by said object being off center and a third point between said first and second points where the slope of said function changes sign, said third point corresponding to the angular orientation of the location on said flat at which a line drawn perpendicular to said flat would pass through the present axis of rotation of said wafer, and said alignment correction means includes means for generating angular correction signals to rotate said object by the angular difference between said angular orientation of said third point and said predetermined angular orientation.

4. The apparatus of claim 3 wherein said object has a plurality of flats, said distinguishing feature comprises the longest flat, and said calculating means comprises means for identifying said longest flat by identifying the said first and second pair of points separated by the greatest angle.

5. The apparatus of claim 3 wherein said information is in the form of pairs of angular orientation and corresponding surface position data sampled during said rotation, and wherein said calculating means includes means for calculating the precise angular orientation of said line from the values of the slopes of said function at said pairs between said points.

6. The apparatus of claim 5 wherein two said slopes are used simultaneously to calculate said precise angular orientation.

7. The apparatus of claim 6 wherein the results of plural calculations using different pairs of slopes are averaged.

8. The apparatus of claims 5, 6 or 7 wherein said sensing means comprises first digital measuring means for digitally measuring the angular orientation of said object, second digital measuring means for digitally measuring the relative height of a portion of said object in said sensing region, and digital recording means, responsive to said first and second digital measuring means, for recording a plurality of pairs of values, one said pair being recorded each time said angular position changes by a predetermined amount, a first value of said pair representing the present said angular position of said object and a second value of said pair representing the present said relative height of said object.

9. The apparatus of claim 2 wherein said sensing means comprises first digital measuring means for digitally measuring the angular orientation of said object, second digital measuring means for digitally measuring the relative height of a portion of said object in said sensing region, and digital recording means, responsive to said first and second digital measuring means, for recording a plurality of pairs of values, one said pair being recorded each time said angular position changes by a predetermined amount, a first value of said pair representing the present said angular position of said object and a second value of said pair representing the present said relative height of said object.

10. The apparatus of claim 9 wherein said object is a semiconductor wafer, and said second digital measuring means comprises a radiation source illuminating the portion of a first face of said wafer in said surface sensing region, a linear array of radiation detectors arranged on a side of said wafer opposite said first face such that, during rotation of said wafer, some of said detectors are exposed to said radiation source and others of said detectors are shielded from said radiation source by said wafer, and means for indicating the number of said detectors not detecting radiation from said source, said number corresponding to the relative height of said wafer.

11. The apparatus of claim 9 wherein said object is a semiconductor wafer, further comprising means for supporting plastic and quartz boats for carrying a plurality of wafers, and wherein said engagement means includes a paddle means adapted to transport wafers between said boats.

12. The apparatus of claim 11 wherein said rotator means is responsive to said orientation signals for rotating said wafer to orient said flat at said predetermined angular position, and said engagement means is responsive to said alignment signals for adjusting the position of said paddle means such that when a said wafer is transferred from said rotator means back to said paddle means the center of the said wafer will be properly aligned in at least one axis.

13. The appartus of claim 11, wherein said rotator means engages the same side of said wafer as said paddle means.

14. The appartus of claim 13 wherein said paddle means comprises a paddle having an opening through which said rotator may approach and engage said wafer.

15. Apparatus for aligning an object having a circular surface defining, in a plane, a circle with a distinguishing feature in it, said apparatus comprising
rotator means for holding said object and rotating said object about a rotation axis so that the entire perimeter of said circular surface travels through a surface sensing region,
engagement means for engaging said object and transferring it to and receiving it from said rotator means,
sensing means for measuring and recording, during rotation of said object, position versus angular orientation information relating to a position of said surface along an axis transverse to said surface,
calculating means, responsive to said sensing means, for calculating from said position versus angular orientation information the angular orientation of said distinguishing feature,
said calculating means comprising means for representing said information as a function having a first variable representing said position and a second variable representing said angular orientation, and for identifying a section of said function where said function has a slope with a magnitude greater than a predetermined amount that is too large to correspond to a slope caused by said object being off center, and
alignment correction means for generating angular correction signals for rotating said object such that said distinguishing feature attains a predetermined angular orientation.

16. Apparatus for aligning an object having a circular surface defining, in a plane, a circle with a distinguishing feature in it, said apparatus comprising
rotator means for holding and rotating said object about a rotation axis so that the entire perimeter of said circular surface travels through a surface sensing region,
engagement means for engaging said object and transferring it to and receiving it from said rotator means,
first digital measuring means for digitally measuring the angular orientation of said object,
second digital measuring means for digitally measuring the relative height of a portion of said object in said sensing region,
digital recording means, responsive to said first and second digital measuring means, for recording a plurality of pairs of values, one said pair being recorded each time said angular position changes by a predetermined amount, a first value of said pair representing the present said angular orientation of said object and a second value of said pair representing the present said relative height of said object,
calculating means, responsive to said digital recording means, for calculating from said position versus angular orientation information the angular orientation of said distinguishing feature, and
alignment correction means for generating angular correction signals for rotating said object such that said distinguishing feature attains a predetermined angular orientation.

17. The apparatus of claim 16 wherein said object is a semiconductor wafer, and said second digital measuring means comprises
a radiation source illuminating the portion of first face of said wafer in said surface sensing region,
a linear array of radiation detectors on the other side of said wafer arranged such that, during rotation of said wafer, some of said detectors are exposed to said radiation source and others of said detectors are shielded from said radiation source by said wafer, and
means for indicating the number of said detectors not detecting radiation from said source, said number corresponding to the relative height of said wafer.

18. The apparatus of claims 15 or 16 wherein said object is a semiconductor wafer, further comprising means for supporting plastic and quartz boats for carrying a plurality of wafers, and wherein said engagement means is adapted to transport wafers between said boats.

19. Apparatus for aligning an object having a circular surface, said apparatus comprising
rotator means for holding and rotating said object about a rotation axis so that the entire perimeter of said circular surface travels through a surface sensing region,
engagement means for engaging said object and transferring it to and receiving it from said rotator means,
first digital measuring means for digitally measuring the angular orientation of said object,
second digital measuring means for digitally measuring the relative height of a portion of said object in said sensing region,
digital recording means, responsive to said first and second digital measuring means, for recording a plurality of pairs of values, one said pair being recorded each time said angular position changes by a predetermined amount, a first value of said pair representing the present said angular orientation of said object and a second value of said pair representing the present said relative height of said object,
calculating means, responsive to said digital recording means, for calculating from said position versus angular orientation information the location of the center of said object with respect to said rotation axis, and
alignment correction means for generating alignment signals for aligning said center with respect to said rotation axis.

* * * * *

UNITED STATES PATENT AND TRADEMARK OFFICE
CERTIFICATE OF CORRECTION

PATENT NO. : 4,765,793
DATED : August 23, 1988
INVENTOR(S) : David Goddeau

It is certified that error appears in the above-identified patent and that said Letters Patent is hereby corrected as shown below:

In the Specification:

Column 6, line 39, "$SLOPE_F$" is changed to --$SLOPE_F,$--.

Column 6, line 40, "$SLOPE_F,$" is changed to --$SLOPE_F$--.

Column 7, line 35, "= (A x (+1) - B x (i)" is changed to --= (A x (i+1) - B x (i))--.

In the Claims:

Column 9, line 17, "to" is changed to --to a--.

Column 10, line 11, "claims" is changed to --claim--.

Signed and Sealed this

Eighteenth Day of April, 1989

Attest:

DONALD J. QUIGG

*Attesting Officer*    *Commissioner of Patents and Trademarks*